United States Patent [19]

Vranish

[11] Patent Number: 5,373,245

[45] Date of Patent: Dec. 13, 1994

[54] CAPACIFLECTOR CAMERA

[75] Inventor: John M. Vranish, Crofton, Md.

[73] Assignee: The United States of America as represented by the Administrator of the National Aeronautics and Space Administration, Washington, D.C.

[21] Appl. No.: 90,230

[22] Filed: Jul. 12, 1993

[51] Int. Cl.⁵ .............................................. G01R 27/26
[52] U.S. Cl. .................................................... 324/662
[58] Field of Search ................ 324/662, 690, 687, 688

[56] References Cited

U.S. PATENT DOCUMENTS

| | | | |
|---|---|---|---|
| 4,908,574 | 5/1990 | Rhoades | 324/690 |
| 4,922,181 | 5/1990 | Pullan | 324/690 |
| 4,992,741 | 2/1991 | Douglas et al. | 324/690 |
| 5,097,216 | 3/1992 | Dimmick, Sr. et al. | 324/690 |
| 5,166,679 | 11/1992 | Vranish et al. | 324/687 |
| 5,214,388 | 5/1993 | Vranish et al. | 324/690 |

*Primary Examiner*—Maura K. Regan
*Attorney, Agent, or Firm*—Robert D. Marchant; Guy M. Miller

[57] ABSTRACT

A capacitive type proximity sensor having improved range and sensitivity between a surface and an intruding object in the vicinity of the surface having a voltage source, a number of outer electrical conductors on the surface with each forming one electrode of a number of sensor capacitors, the other electrode for each sensor capacitor being the object. The outer conductors are made from thin sheets of conductive material covered with insulation. An intermediate electrical conductor is located between the outer conductors and the surface and is of a size larger than the outer conductors to act as a shield for reducing the parasitic capacitance between the outer conductors and the surface. The intermediate conductor is also made from a thin sheet of conductive material covered with insulation. The outer conductors and the intermediate conductor are attached to the surface with no gap between the insulation on the conductors and no gap between the surface and the insulation on intermediate conductor, the outer conductors and the intermediate conductor conjoining with each other and with the surface, with the surface acting as a ground plane. A current-measuring voltage follower circuit is connected to the voltage source for coupling in phase and amplitude the instantaneous voltage at the voltage source to the outer electrical conductors and the intermediate electrical conductor. This circuit is responsive to the change in capacitance of the sensor capacitors and generates a number of output signals.

8 Claims, 11 Drawing Sheets

CAPACIFLECTOR CAMERA

ORIGIN OF THE INVENTION

The invention described herein was made by an employee of the United States Government, and may be manufactured and used by or for the Government for governmental purposes without the payment of any royalties thereon or therefor.

CROSS REFERENCE TO RELATED APPLICATIONS

This invention is related to an invention shown and described in (1) U.S. Ser. No. 07/889,577 entitled "Phase Discriminating Capacitive Array Sensor System", filed in the name of John M. Vranish, the present inventor, on May 28, 1992 now U.S. Pat. No. 5,214,388, issued May 25, 1993; (2) U.S. Ser. No. 07/979,987 entitled "Steering Capaciflector Sensor" filed in the name of Jenstrom et al. on Nov. 23, 1992; (3) U.S. Ser. No. 08/008,426 entitled "Double-Driven Shield Capaciflector Type Proximity Sensor", filed in the name of John M. Vranish the present inventor, on Jan. 25, 1993; (4) U.S. Ser. No. 08189,344 entitled "Current Measuring Op-amp Devices" filed in the name of John M. Vranish, the present inventor, on Jan. 31, 1994. The above are assigned to the assignee of the present invention. Moreover, the teachings of these related applications is herein meant to be incorporated by reference.

TECHNICAL FIELD

This invention relates to capacitive proximity sensors and more particularly to a capacitive sensor that will permit 3-D imaging by electrically scanning rows and columns useful for collision avoidance situations.

BACKGROUND ART

Capacitive-Controlled Oscillator (CCO) based "capaciflector" proximity sensors and CCO based sensor arrays are available (see FIG. 1a and U.S. Pat. No. 5,166,679 for a discussion of the basic "capaciflector" technology). However, CCO based "capaciflector" sensors can be used as arrays only where the separation between individual sensors can be made large, such as 3 to 6 inches. Also, for a "capaciflector" sensor to perform efficiently, the shield must be much larger that the sensor (on the order of 7 times wider) and each sensor must have its own shield. The shield is slaved to the sensor via a voltage follower, so it changes frequency with the sensor. If another sensor is introduced, another CCO and voltage follower shield must be added. Hence, the sensors must be spaced no closer than the width of the shields. Even then, there is some cross talk because the two sensors are out of phase with each other. This application is satisfactory for collision avoidance arrays and rudimentary alignment, but an entirely new approach is necessary for a "capaciflector" camera.

Tactile capacitive arrays using pixels are also available in the research environment and appear to be practical for medical and industrial applications. However, these devices have such a short range that they would not have the depth of view necessary for good capacitive 3-D proximity images and they would be impractical for robotic collision avoidance purposes (frequently part of the "capaciflector" camera imaging function). Also, without the current-measuring voltage follower electronics architecture described in this disclosure (and an active current bridge version of the same), there will be cross talk between the pixels and/or their leads.

"Capaciflector" 3-D imaging using a single sensor has also been achieved in the prior art. In this application, the single "capaciflector" sensor is moved through a volume with sensor readings being taken sequentially in the process. These readings are compared with the robot joint angles and a 3-D image results. There are three disadvantages to this type of system; first, large volumes often must be swept out in order to obtain a complete picture and this may not be possible or practical in a docking or berthing application; second, the process takes a considerable amount of time; and third, the measurements must be correlated with robot joint angle information which introduces further inaccuracies.

STATEMENT OF THE INVENTION

It is therefore an object of the present invention to provide a sensor with multiple, independently-sensing "capaciflector" sensors in close proximity to each other sharing a common reflecting shield to facilitate robotic collision avoidance and berthing/docking.

Another object of the present invention is to provide a capacitive camera that will provide a 3-D image to give a robot a physical model of the region being observed by the camera.

A further object is to provide a sensor with a narrow bandwidth thereby providing increased range and sensitivity with less noise and EMI problems than current devices.

These and other objects are achieved by providing a device with several sensors placed in close proximity to each other above a driven shield with each sensor and shield interfaced to a common voltage source by current-measuring voltage follower circuits. All sensors and the shield are thus locked to the voltage source both in amplitude and in phase, and the shield "shields" all sensors from ground providing the desired "capaciflector" effect. An additional shield can be added and is a "floating" shield, which is not necessary for proper operation of this circuit, but can be added for use as an additional "sensor" if desired; it also has its own current-measuring voltage follower circuit. The floating shield is, itself, shielded from ground by the ground-coupled shield so it can "see" between the individual sensors to give an overall extended range reading. This device also has a reference circuit and an amplification circuit to further process the signals from the sensors and provide an output which can be utilized as a control signal.

Functionally there is no difference between the shield and the sensors so each sensor "sees" the other sensors as a reflecting shield and vice versa, thus eliminating cross talk between the sensors. As an object approaches the sensors, different currents pass through each sensor, depending upon its location relative to the object, and each of these currents are "measured", independently, by the sensors' associated current-measuring voltage follower circuit. The result is independent sensing by the sensors in close proximity to each other and with outstanding range and sensitivity for each sensor.

FIG. 4b shows a perspective of the "capaciflector" camera embodiment. Multiple sensors 12 ($12_1$–$12_7$ for seven rows and $12_a$ to $12_f$ for six columns) are used in conjunction with floating shield 1 and ground-coupled shield 2. Although seven rows and six columns are shown, any number of rows and columns can be used. As in the original "capaciflector" sensors 12 and shields 1 (if used) and 2 are strips of conductive material with an insulative coating. Each sensor strip 12 is attached to floating shield 1 (if used) with no gap between the insulation on shield 12 and the insulation on shield 1 (or shield 2 if shield 1 is not used); likewise, shield 2 is attached to surface 15 with no gap between the insulation on shield 2 and surface 15. In order to have both rows and columns, it is necessary to have sensor strips 12 pass over and under each other in the weave geometry shown. This sensor array of seven rows and six columns behaves exactly as described for the multiple sensors shown in FIGS. 3a and 3b except that each sensor strip 12 must alternately pass over and under other sensor strips 12. As described above, each sensor strip 12 "sees" the other sensor strips as shields, so the presence of these other sensor strips will be insignificant in terms of leakage.

BRIEF DESCRIPTION OF THE DRAWINGS

FIG. 3b is a diagram of the multiple sensor fields of FIG. 3a.

DETAILED DESCRIPTION OF THE INVENTION

The "capaciflector" camera sensor will be a fundamental building block of NASA robotics for use in berthing and docking for robotic construction, assembly and maintenance in outer space and for imaging and navigation for planetary rover robots. The ability to place individual "capaciflector" sensors in close proximity to each other as a "capaciflector" camera enables docking and berthing pins, and holes and latches to be precisely imaged in 3-D. Since the "capaciflector" camera gives monotonically accelerating stronger signals as it is closer to an object, the "capaciflector" camera will give very precise images in close to the object, the very region where other imaging techniques, such as standard cameras and lasers have problems. And, because several "capaciflector" camera sensors can be placed on or near pins, latches and holes, the information available at or near the points of contact between the payload and the fixture it is being mated to will be exceptionally good. For exploration robots, the "capaciflector" camera will provide close-in images which will prove invaluable in obstacle avoidance and navigation.

Figure 1A:
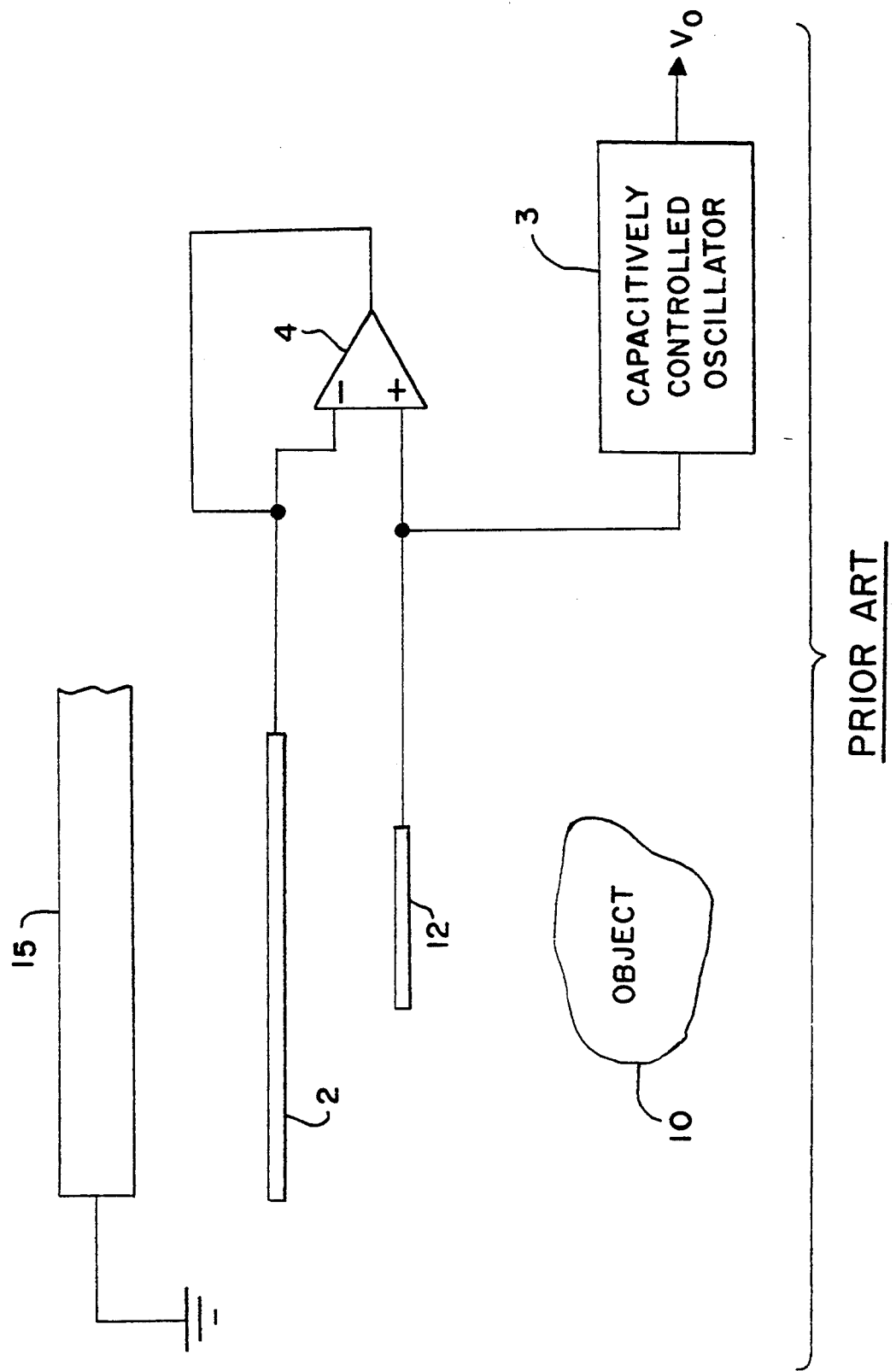
FIG. 1a is a circuit diagram of a prior art "capaciflector" using capacitively-controlled oscillator technology.
Figure 1B:
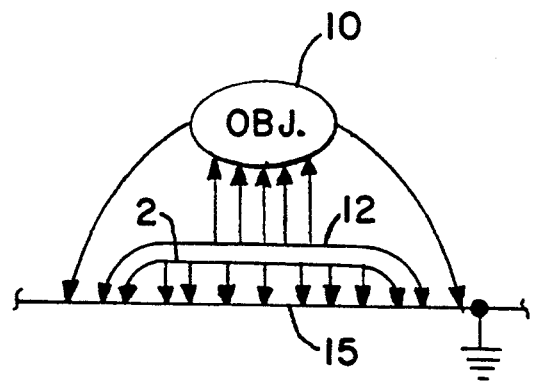
FIG. 1b shows the prior art "capaciflector" principle.

The fundamental advantages of capacitive-based sensors are retained in this new embodiment of the original "capaciflector" which is described in detail in U.S. Pat. No. 5,166,679 and shown schematically in FIG. 1a where a capacitive proximity sensing element 12, backed by a reflector shield 2 driven by op-amp 4 at the same voltage as and in phase with sensor 12, is used to reflect the field lines away from a grounded surface 15 towards an intruding object 10. The output signal from sensor 12 is coupled to capacitively controlled oscillator circuit 3 whose output is inversely proportional to the capacitance of sensor 12. The advantages of this type sensor system include: a simple, rugged, flexible configuration that can fit on the surface of any structure; ability of the system to function in outer space; the ability to sense virtually any object it encounters; the ability of the sensor to "see"-through paint and other protective coatings; and, low power. The previous problem of inadequate range has also been solved by "capaciflector" technology.

Figure 1C:
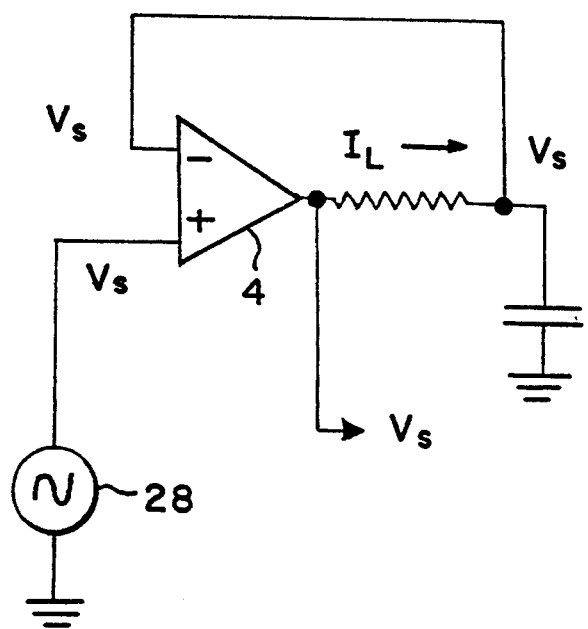
FIG. 1c is a schematic diagram of a current-measuring voltage follower circuit.

An electronic circuit architecture is disclosed in my "Current-Measuring Op-amp Devices" U.S. patent application, referenced above, that is particularly useful in my "capaciflector" camera. The innovative circuit element is called a current measuring voltage follower and is shown in FIG. 1c. Because op-amp 4 is, in effect, a micro-miniature precision high-gain servo system, source 28 voltage $V_s$, at the + terminal of op-amp 4, is served through op-amp 4 to its—terminal. Although both of the input terminals of op-amp 4 are of high impedance, op-amp 4 is also a current source with a low impedance output. Therefore, if the current-measuring voltage follower circuit of FIG. 1c is inserted between each of a series of sensors, and excites them by a common voltage source, the voltage drop (amplitude and phase) across the sensors will be nearly identical, and essentially the same as the voltage source. As with any feedback system, there are slight losses, but these are in microvolts and of no practical importance. The current through each sensor will also vary according to what it "senses" and this current changes can be "measured" by the sensors' current-measuring voltage follower circuit. A standard voltage follower circuit, on the other had, would supply the required sensor current, but would not "measure" it.

Figure 2:
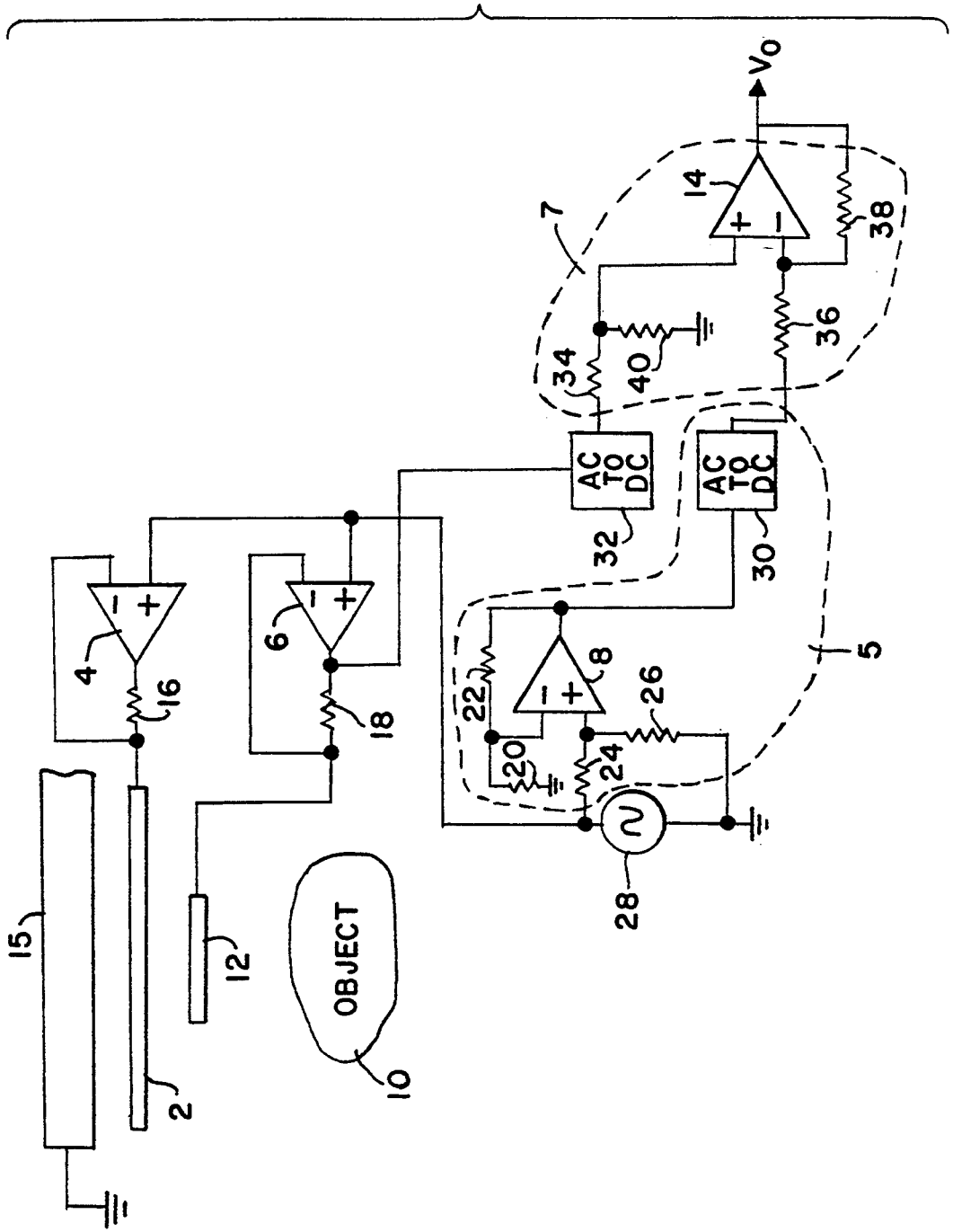
FIG. 2 is a circuit diagram of a source-locked "capaciflector" utilizing current-measuring voltage follower circuits.

FIG. 2 shows schematically a source-locked "capaciflector" sensor system that uses my current-measuring voltage follower circuit (op-amp 6, resistor 18) to interface source 28 voltage to sensor 12 and also a second one of my current-measuring voltage follower circuits (op-amp 4, resistor 16) to interface source 28 voltage to shield 2, located above grounded surface 15. This effectively locks both sensor 12 and shield 2 to source 28 voltage, and to each other, and therefore shield 2 electrical fields serve to block the path of sensor 12 electrical fields to ground, resulting in a "capaciflector" action and with it increased range and sensitivity. The remaining components of FIG. 2 represent standard electronic circuits; resistors 20, 22, 24, 26 and op-amp 8 comprise reference circuit 5 which extracts a reference voltage from source 28, which is converted to a DC current by AC to DC converter 30; the signal from sensor 12 "measured" by its current measuring voltage follower circuit is converted to DC by AC to DC converter 32; the difference between these two "signals" is then amplified by amplification circuit 7 containing resistors 34, 36, 38, 40 and op-amp 14; the amplified signal is then supplied as output signal Vo to a suitable measurement-/display device (not shown).

With the approach of object 10, current through sensor 12 increases and this increased current is detected by a change in voltage across resistor 18 in sensor 12's current-measuring voltage follower circuit. Shield 2 will also "see" object 10, and its increased current flow through resistor 16 can also be detected, if desired, although this is not shown on FIG. 2. The FIG. 2 "capaciflector" circuit works for a fixed, as well as variable frequency so it is possible to use a crystal-controlled oscillator as source 28, if desired, thereby reducing frequency drift over long periods of time in outer space and to increase range and sensitivity by using a very narrow band system.

Figure 3A:
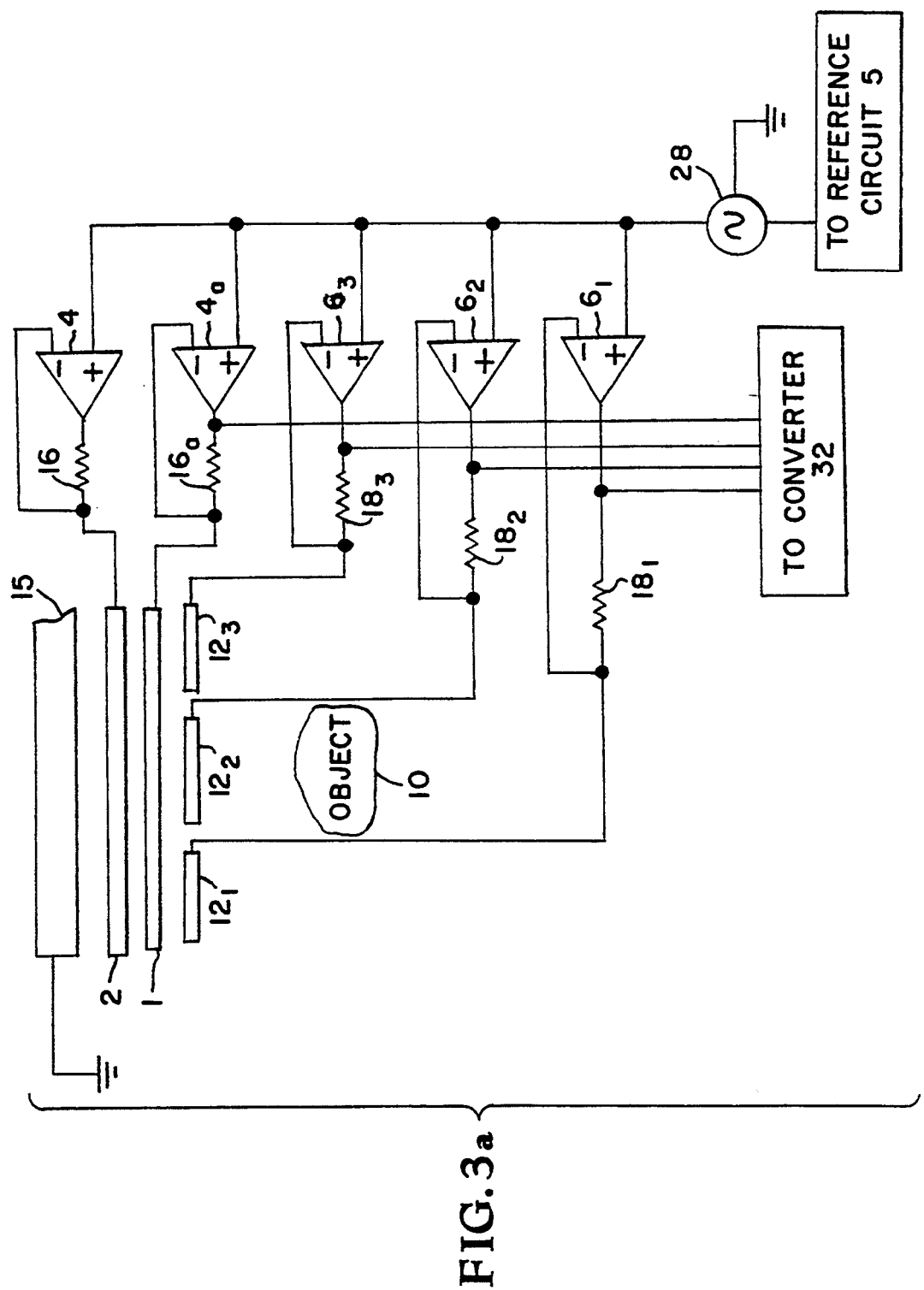
FIG. 3a is a schematic diagram of a multiple sensor "capaciflector" circuit utilizing current-measuring voltage follower circuits.
Figure 3B:
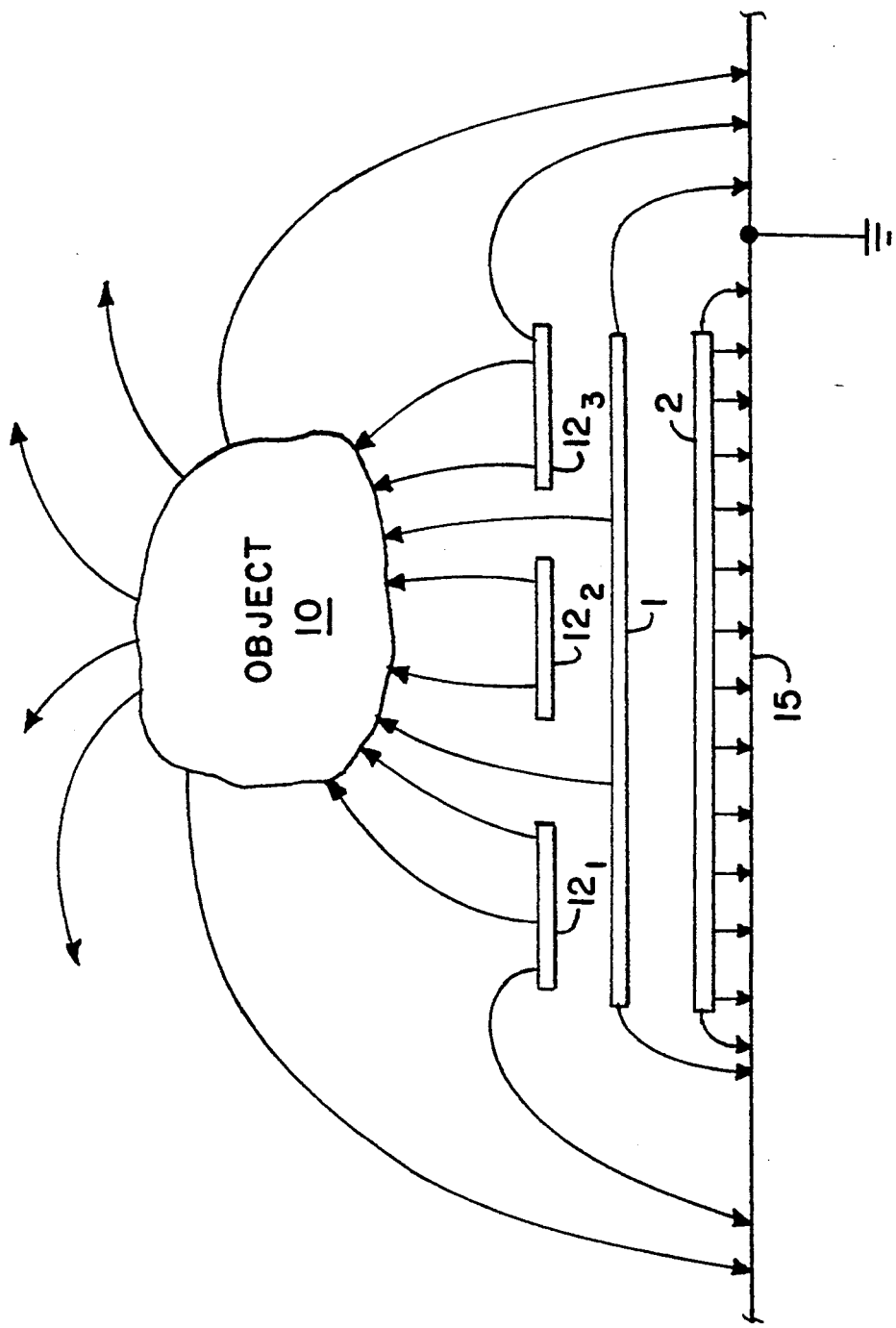

The circuit shown in FIG. 3a extends the FIG. 2 source-locked "capaciflector" concept to one involving several (in this case three) sensors 12 in close proximity to each other. FIGS. 3a and 3b also introduce the use of two reflective shields. As shown, if several sensors 12 (i.e., $12_1$, $12_2$, $12_3$) are placed in close proximity to each other above driven shield 2 and if each sensor 12 (and shield 2) are interfaced to a common voltage source 28 by current-measuring voltage follower circuits (op amp $6_1$ and resistor $18_1$ for sensor $12_1$; op amp $6_2$ and resistor $18_2$ for sensor $12_2$; and op amp $6_3$ and resistor $18_3$ for sensor $12_3$) then all sensors 12 as well as shield 2 are locked to voltage source 28 both in amplitude and in phase, and shield 2 "shields" all sensors 12 from ground providing the desired "capaciflector" effect. The additional shield 1 is a "floating" shield, which is not necessary for proper operation of this circuit, but can be added for use as an additional "sensor" if desired; it also has its own current-measuring voltage follower circuit of op amp $4_a$ and resistor $16_a$. Floating shield 1 is, itself, shielded from ground by the ground coupled shield 2 so it can "see" between the individual sensors 12 to give an overall extended range reading. Although not explicitly shown, just as in FIG. 2 this circuit also has a reference circuit 5 and an amplification circuit 7 to complete the schematic.

Functionally there is no difference between shield 2 and sensors 12 so each sensor 12 "sees" the other sensors as a reflecting shield and vice versa, thus eliminating cross talk between sensors 12. As object 10 approaches sensors 12, different currents pass through each sensor 12, depending upon its location relative to object 10, and each of these currents are "measured", independently, by sensors' 12 associated current-measuring voltage follower circuit. The result is independent sensing by sensors 12 in close proximity to each other and with outstanding range and sensitivity for each sensor 12.

Figure 4A:
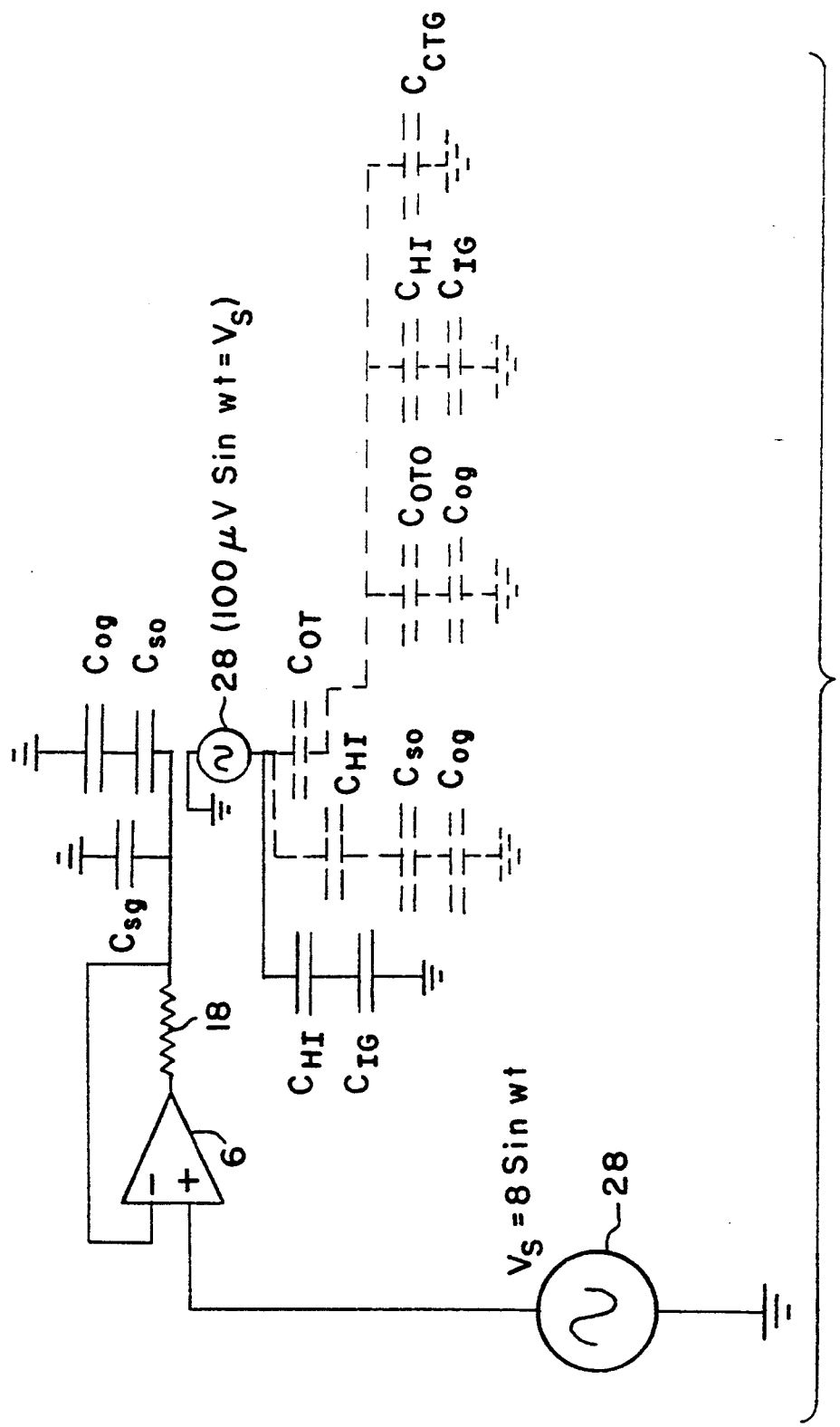
FIG. 4a is a schematic diagram of the "capaciflector" camera parasitic capacitances.
Figure 4B:
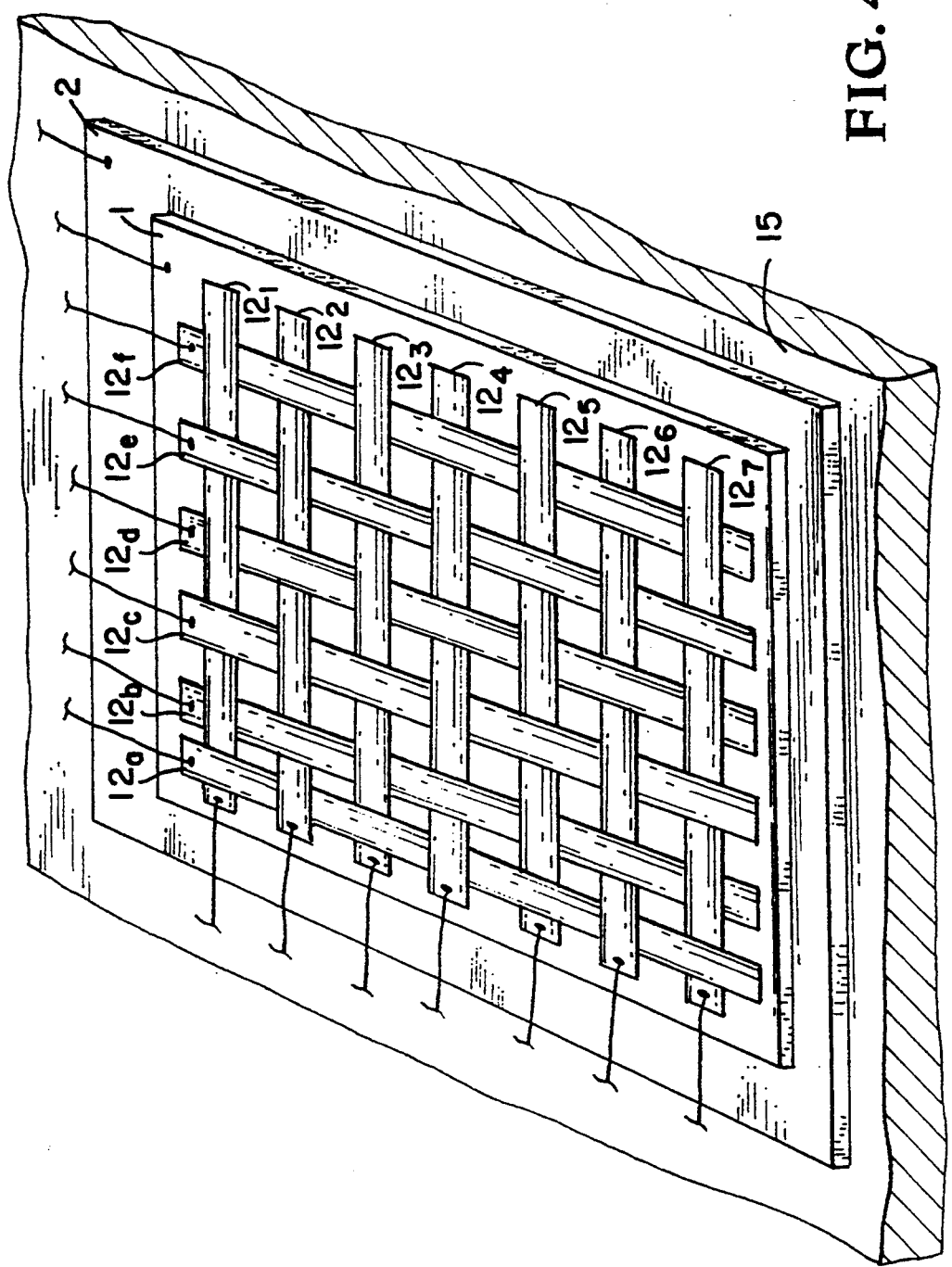
FIG. 4b is a perspective view of the "capaciflector" camera elements.

FIG. 4b shows the source-locked "capaciflector" concept extended still further to an entire "capaciflector" camera embodiment. Multiple sensors 12 ($12_1$–$12_7$ for seven rows and $12_a$ to $12_f$ for six columns) are used in conjunction with floating shield 1 and ground-coupled shield 2. Although seven rows and six columns are shown, any number of rows and columns can be used. As in the original "capaciflector", sensors 12 and shields 1 (if used) and 2 are strips of conductive material with an insulative coating. Each sensor strip 12 is attached to floating shield 1 (if used) with no gap between the insulation on sensor 12 and the insulation on shield 1 (or shield 2 if shield 1 is not used); likewise, shield 2 is attached to surface 15 with no gap between the insulation on shield 2 and surface 15. In order to have both rows and columns, with equal access to the object by each, it is necessary to have sensor strips 12 pass over and under each other in the weave geometry shown. This sensor array of seven rows and six columns behaves exactly as described for the multiple sensors shown in FIGS. 3a and 3b except that each sensor strip 12 must alternately pass over and under other sensor strips 12. As described above, each sensor strip 12 "sees" the other sensor strips as shields, so the presence of these other sensor strips will be insignificant in terms of leakage.

The parasitic capacitances for a single sensor strip 12 of the FIG. 4b embodiment are given in the equivalent circuit shown in FIG. 4a where the dashed lines represent leakages to other elements and:

$C_{so}$ = sensor to object capacitance $C_{og}$ = object to ground capacitance (assumed to be large)

$C_{sg}$ = sensor to ground capacitance (typically approx. 6 pf)

$C_{HI}$ = sensor to High Impedance shield capacitance (typ. approx. 120 pf)

$C_{IG}$ = High Impedance Shield to ground capacitance (typ. approx. 800 pf)

$C_{OTO}$ = secondary sensor to object capacitance (typ. approx. 6 pf)

$C_{OTG}$ = secondary sensor to ground capacitance (typ. approx. 6 pf)

$C_{OT}$ = sensor to secondary sensor capacitance

The potential difference between any sensor 12 and ground through these parasitics is less than 50 micro volts.

Current leakage in the "capaciflector" camera is not noticeably reduced from that of a single sensor "capaciflector". Each current-measuring voltage follower circuit tracks the voltage across its resistive load to within 100 $\mu$V of source 28 voltage. Using an insulation separation between sensor strips passing over and under each other of 0.005 in., a leakage field of 20 mV/in. from one sensor 12 to adjacent sensor 12 and from any sensor 12 to shield 1 exists. Assuming a minimum or worst case distance of 3 in. from the edge of shield 2 and assuming a maximum load voltage (typical) of 8 V, a ground return leakage voltage of 2.6 V/in. is typical. The ground return leakage is therefore 130 times that of the leakage caused by the current-measuring voltage follower circuits. For an object 10 approaching the "capaciflector" camera, a 20 mV/in. field is induced at a range of approx. 33 ft. when a 1 ft. range is required. These figures represent worst case assumptions. Leakage between sensor 12 strips and or shield 2 requires the charge to leak across at least two shields in series so the real leakage field is orders of magnitude below 20 Mv/in.

Alternate Embodiments of the Invention

Figure 4C:
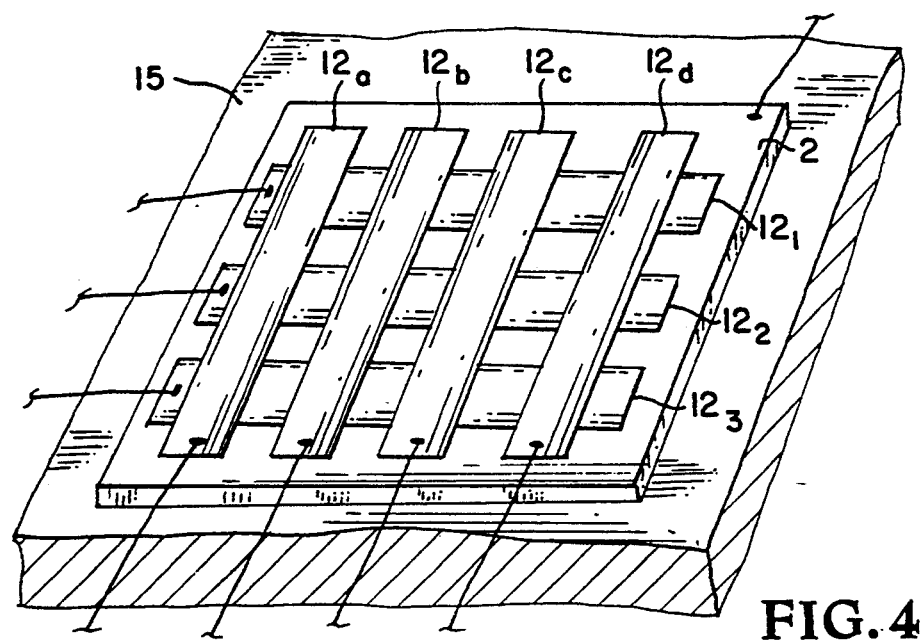
FIG. 4c is a perspective view of an alternate embodiment of the "capaciflector" camera elements.

FIG. 4c shows an alternate embodiment "capaciflector" camera to that depicted in FIG. 4b. In this embodiment, multiple sensors 12 ($12_1$–$12_3$ for three rows and $12_a$ to $12_d$ for four columns) are used in conjunction with ground-coupled shield 2. Although three rows and four columns are shown, any number of rows and columns can be used. As in the FIG. 4b "capaciflector" camera, sensors 12 and shield 2 are strips of conductive material with an insulative coating. Although not shown, a floating shield could also be used in this embodiment. Each sensor strip 12 is attached to shield 2 with no gap between the insulation on sensor 12 and the insulation on shield 2; likewise, shield 2 is attached to surface 15 with no gap between the insulation on shield 2 and surface 15. In order to compensate for the unequal access to the object by each sensor strip 12, it is necessary to have sensor row strips 12 larger the sensor column strips 12 as shown. This sensor array of three rows and four columns behaves nearly the same as described for the multiple sensors shown in FIG. 4b. A minimum amount of simple calibration will be needed with this design.

Figure 4D:
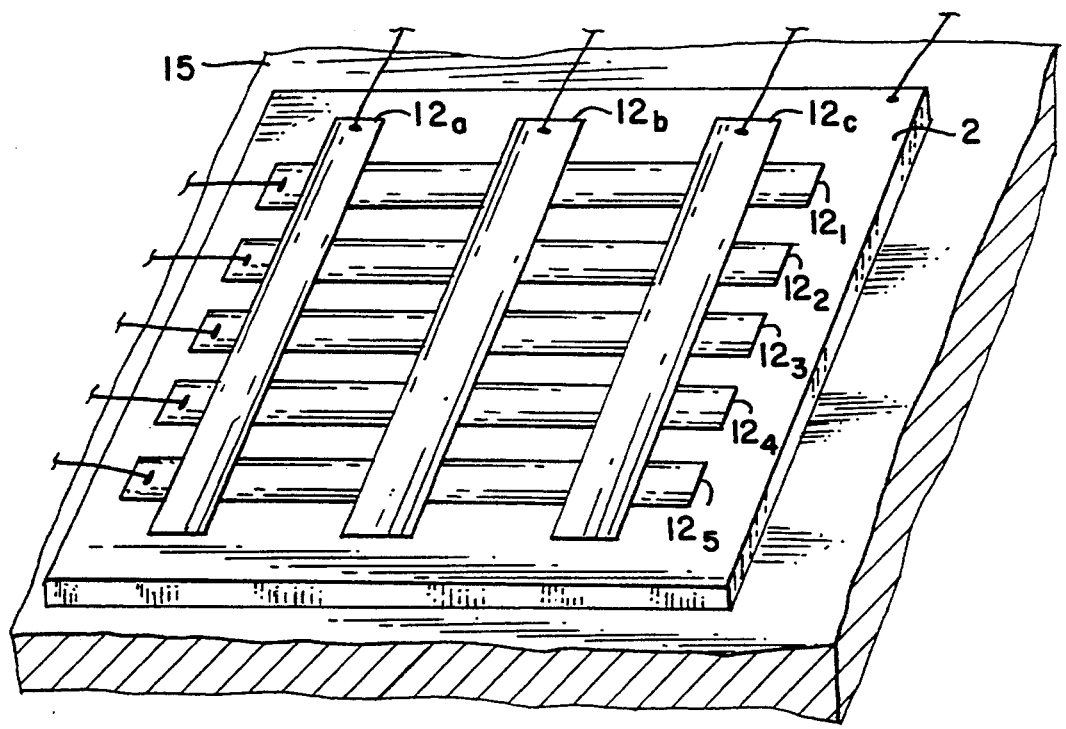
FIG. 4d is a perspective view of another alternate embodiment of the "capaciflector" camera elements.

FIG. 4d shows another alternate embodiment "capaciflector" camera to that depicted in FIG. 4b. In this embodiment, multiple sensors 12 ($12_1$–$12_5$ for five rows and $12_a$ to $12_c$ for three columns) are used in conjunction with ground-coupled shield 2. Although five rows and three columns are shown, any number of rows and columns can be used. As in the FIG. 4b "capaciflector" camera, sensors 12 and shield 2 are strips of conductive material with an insulative coating. Although not shown, a floating shield could also be used in this embodiment. Each sensor strip 12 is attached to shield 2 with no gap between the insulation on sensor 12 and the insulation on shield 2; likewise, shield 2 is attached to surface 15 with no gap between the insulation on shield 2 and surface 15. In this embodiment, the unequal access to the object by each sensor strip 12 is compensated for by sensor row columns 12 spaced larger apart than the sensor row strips 12 as shown. This sensor array of five rows and three columns behaves nearly the same as described for the multiple sensors shown in FIG. 4b. A minimum amount of simple calibration will be needed with this design.

Figure 5A:
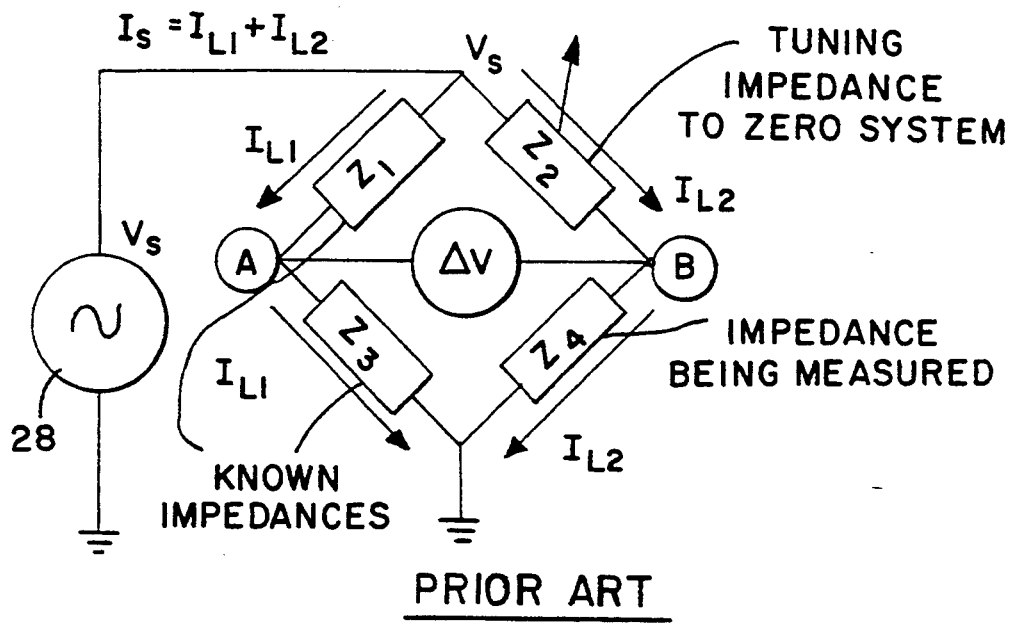
FIG. 5a is a circuit diagram of a classic Wheatstone bridge utilized in the prior art.
Figure 6:
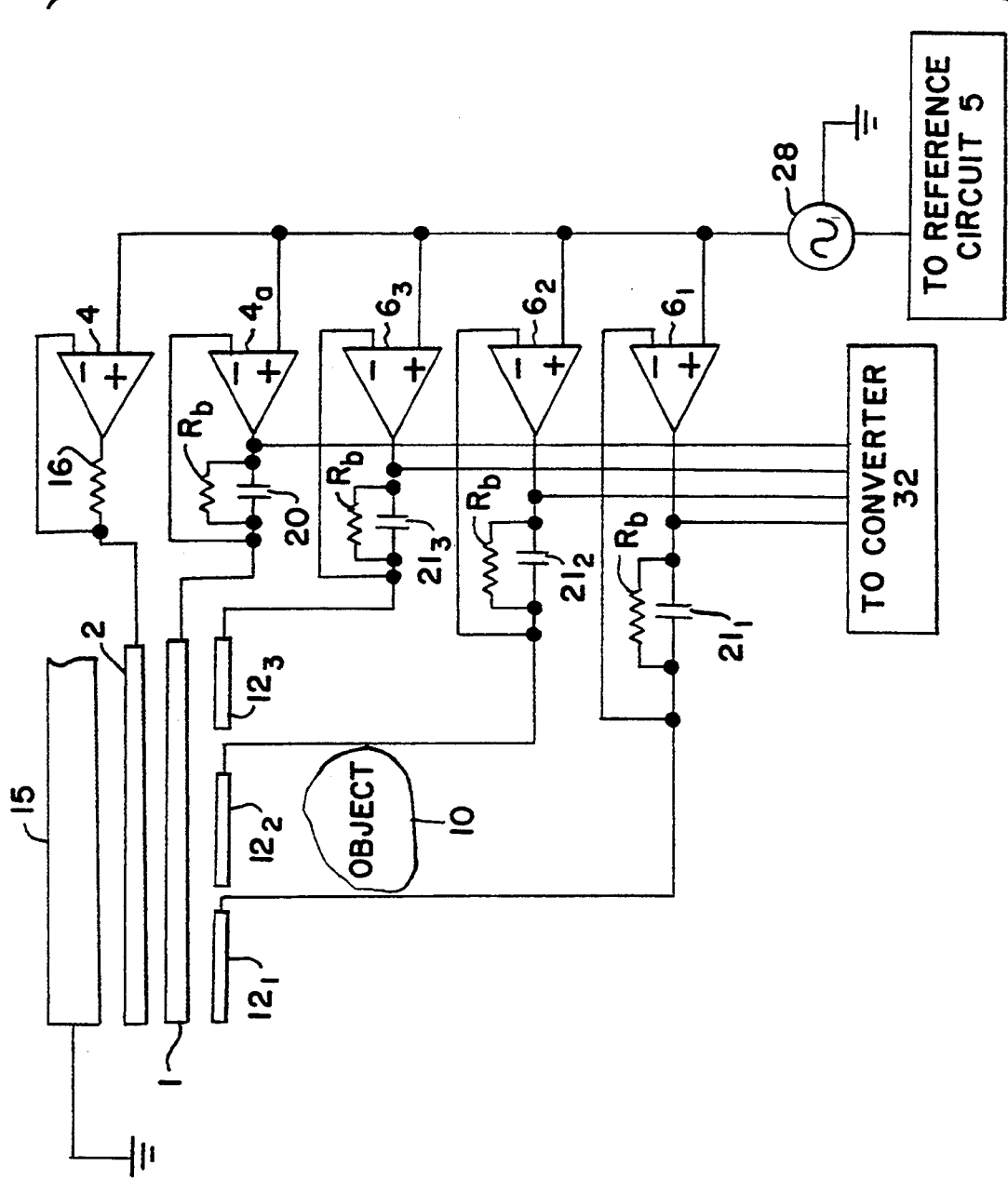
FIG. 6 is a schematic diagram of an alternate embodiment "capaciflector" camera using active current bridge sensor array circuits.

A classic Wheatstone bridge circuit, as shown in FIG. 5a, normally performs the role in signal detection now performed by an active current bridge in the alternate embodiment of the "capaciflector" camera shown in FIG. 6. A classic Wheatstone bridge operates as a voltage divider. The voltage down the left leg is identical to that down the right. The voltage down the left leg divides according to the impedances $Z_1$ and $Z_4$ at point A and that down the right leg divides according to the impedances $Z_2$ and $Z_3$ at point B. Thus, as $Z_4$ varies (as in the case of a sensor) the voltage difference between points A and B changes and the voltage meter joining these two points reflects that change. For two sensors (or a sensor and a reference), this difference in potential results in leakage (or crosstalk). This can be a very significant problem which increases as the imbalance grows (as in very high sensor readings).

Figure 5B:
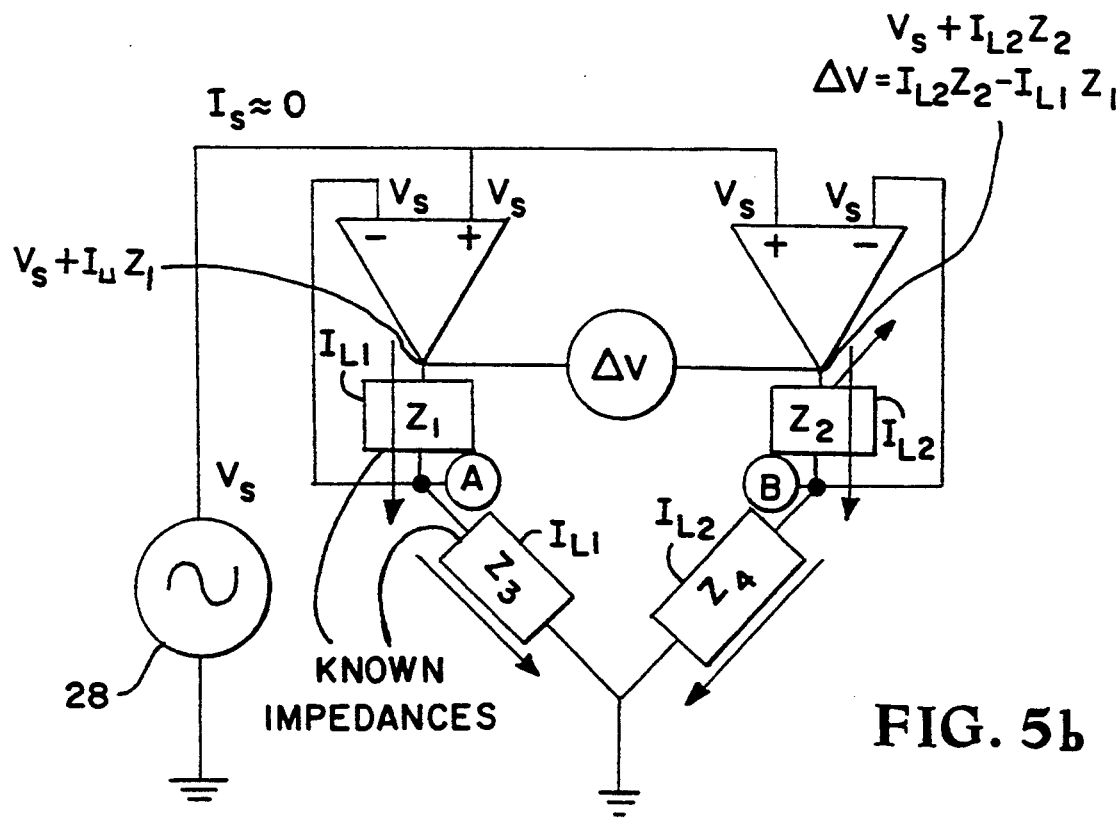
FIG. 5b is a circuit diagram of an active current bridge.

The active current bridge shown in FIG. 5b arranges current-measuring voltage follower circuits and impedances in a bridge configuration similar to the Wheatstone bridge. In the FIG. 5b circuit the voltage across points A and B is always equal no matter how much $Z_4$ varies. Thus, leakage (or crosstalk) is significantly reduced. This condition holds true even at very high sensor readings.

FIG. 6 shows an alternate embodiment of my "capaciflector" camera using current-measuring voltage follower circuits in an active current bridge arrangement (in contrast to a Wheatstone bridge arrangement). Capacitors 20 and $21_1$, $21_2$, $21_3$ are used in the current-measuring voltage follower circuits (rather than resistors) for the current "measuring" function to eliminate the phase shift between the voltage measured directly at the output of current-measuring op-amps $4_a$ and $6_1$, $6_2$, $6_3$ and source 28 voltage, no matter how object 10 to sensor 12 proximity changes. The parallel resistors $R_b$, which accompany each of these capacitors is very large and serves only to permit op-amp bias currents to bleed off. It is also possible to adjust the $R_b$ and capacitors values to provide a nominal phase shift value if desired. This would be useful in phase measuring schemes.

FIG. 5b illustrates the active current bridge used in the FIG. 6 alternate embodiment. In the active current bridge, common voltage source 28 is fed into a left and right current-measuring voltage follower which form the first element of the left leg and the first element of the right leg respectively. The left leg current, $I_{L1}$, is generated by the left current-measuring voltage follower and the right leg current, $I_{L2}$, by the right current-measuring voltage follower. The left leg current proceeds through reference $Z_1$ to point A and from there across reference $Z_3$ to ground. The right leg current proceeds through reference $Z_2$ to point B and from there across unknown impedance $Z_4$ to ground. The voltage drop from points A and B to ground are identical and equal to the source 28 voltage $V_s$. The right leg current, $I_{L2}$, is adjusted by the right leg op-amp as $Z_4$ changes to keep the voltage drop across $Z_4$ locked to $V_s$. This, however, changes the voltage across reference $Z_2$. Thus, there is a voltage differential between the voltage drop across $Z_2$ and that across $Z_1$ and it is here where the bridge measurement is made. The differential voltage measurement is in front of impedances $Z_1$ and $Z_2$ in the active current bridge and is behind those impedances in the classical Wheatstone bridge. $I_s \approx 0$ for the active current bridge, whereas $I_s = I_{L1} + I_{L2}$ for the classical Wheatstone bridge.

Figure 7:
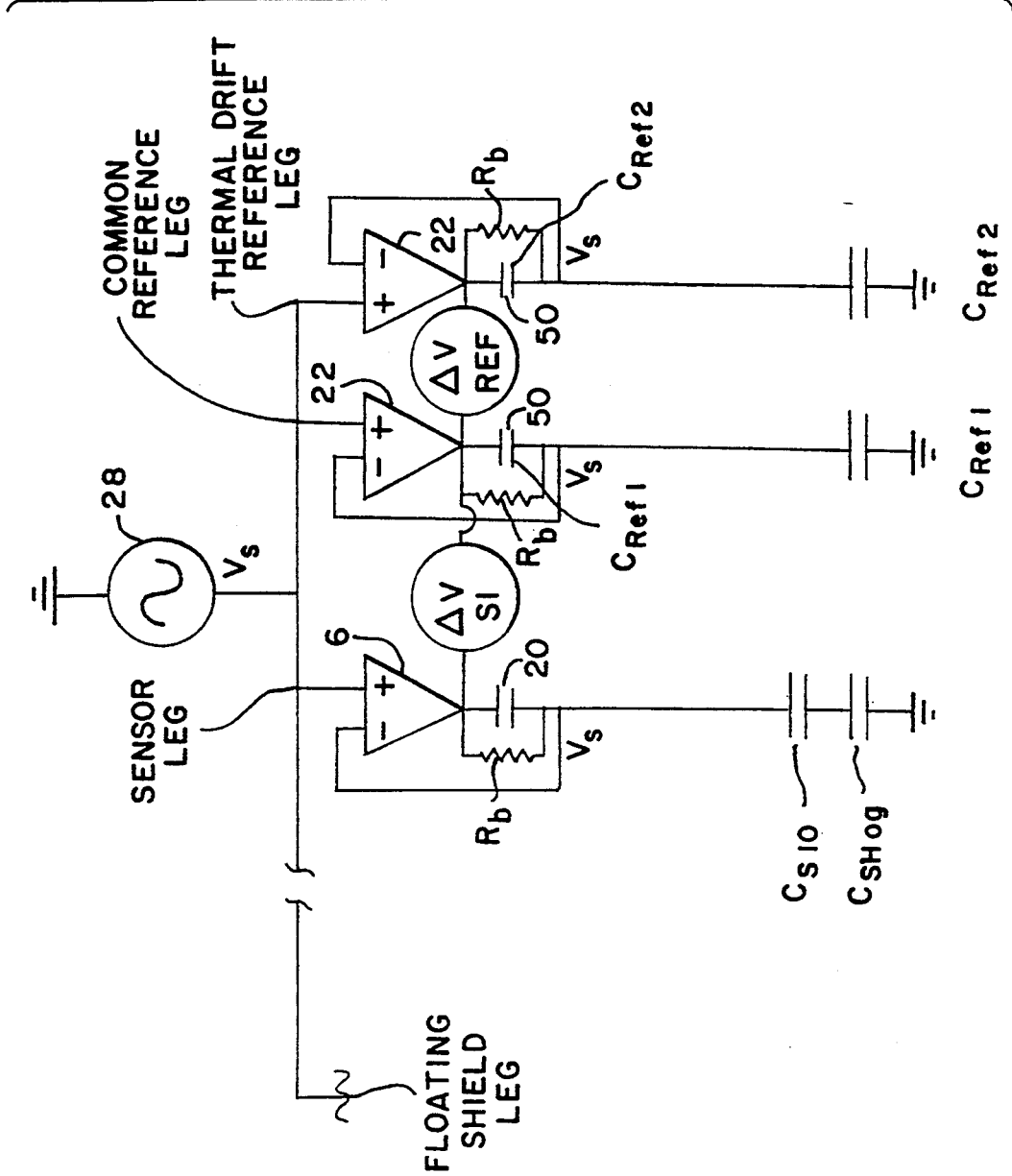
FIG. 7 is a circuit diagram of an active current bridge sensor array.

FIG. 7 shows how the active current bridge is utilized in the alternate embodiment "capaciflector" camera of FIG. 6. To reduce the effects of phase shifts in the bridge, with its capacitive loads, current-measuring capacitors 20 are installed in the current-measuring voltage follower circuits. A capacitor in a current-measuring voltage follower tends to integrate the offset voltages of op-amp 6, thus a large charge-bleeding resistor $R_b$ is inserted in parallel with capacitor 20. The common reference leg of the bridge consists of a current-measuring voltage follower circuit which is identical with the other bridge legs and a reference capacitive load $C_{Ref1}$ which is the average of the sensor 12 element loads (except that it is not effected by the approach of an object) and a reference current-measuring capacitor 50 which is the average of the current-measuring capacitors 50. Each sensor 12 element acts as a bridge leg and is compared with the reference leg as is the floating shield leg. There is one bridge (complete with reference leg) for the rows and one for the columns. The floating shield 1 will be the leg of either the column or the row bridge. The ground-coupled shield 2 will not be compared and so will not belong to either bridge. Each bridge will also have a second thermal drift reference current-measuring voltage follower circuit and reference capacitive load, but with a slight bridge voltage between the two reference legs leading to a reference voltage all the way through the amplification system. This voltage can change only as a result of thermal changes in the reference components and, so, gives an indication of the thermal drift in the rest of the bridge.

To those skilled in the art, many modifications and variations of the present invention are possible in light of the above teachings. It is therefore to be understood that the present invention can be practiced otherwise than as specifically described herein and still will be within the spirit and scope of the appended claims.

I claim:

1. A capacitive type proximity sensor having improved range and sensitivity between a surface and an intruding object in the vicinity of the surface comprising:

a voltage source;

a plurality of outer electrical conductors on said surface each forming one electrode of a plurality of sensor capacitors, the other electrode for each sensor capacitor comprising said object, said plurality of outer conductors comprising thin strips of conductive material covered with insulation and arranged in rows and columns;

an intermediate electrical conductor located between said plurality of outer conductors and said surface and being of a size larger than said plurality of outer conductors to act as a shield for reducing the parasitic capacitance between said plurality of outer conductors and said surface, said intermediate conductor comprising a thin sheet of conductive material covered with insulation;

said plurality of outer conductors and said intermediate conductor attached to said surface with no gap between the insulation on said conductors and no gap between said surface and the insulation on said intermediate conductor, said plurality of outer conductors and said intermediate conductor conjoining with each other and with said surface, said surface acting as a ground plane; and measurement circuit means, connected to said voltage source, for coupling in phase and amplitude the instantaneous voltage at said voltage source to said plurality of outer electrical conductors and said intermediate electrical conductor, said measurement circuit means responsive to the change in capacitance of said plurality of sensor capacitors for generating a plurality of output signals.

2. The sensor of claim 1 wherein said thin strips arranged in rows and columns are arranged in a basket weave fashion.

3. The sensor of claim 1 wherein said thin strips arranged in rows and columns are arranged such that the rows are underneath the columns with the row strips wider than the column strips.

4. The sensor of claim 1 wherein said thin strips arranged in rows and columns are arranged such that the rows are underneath the columns with the spacing between the column strips wider than the spacing between the row strips.

5. The sensor of claim 1 wherein said measurement circuit means comprises a plurality of current-measuring voltage follower circuits each comprised of an op-amp and a resistor.

6. The sensor of claim 1 wherein said measurement circuit means comprises a plurality of current-measuring voltage follower circuits each comprises of an op-amp, a resistor and a capacitor.

7. The sensor of claim 1 wherein said measurement circuit means comprises a plurality of active current bridge circuits.

8. The sensor of claim 1 further comprising an additional electrical conductor located between said plurality of outer electrical conductors and said intermediate electrical conductor and being of a size larger than said plurality of outer conductors but less than or equal to the size of said intermediate conductor, said additional conductor comprising a thin sheet of conductive material covered with insulation.

* * * * *